United States Patent

Inatomi

(10) Patent No.: US 9,016,231 B2
(45) Date of Patent: Apr. 28, 2015

(54) SUBSTRATE PROCESSING METHOD AND SUBSTRATE PROCESSING SYSTEM

(71) Applicant: Tokyo Electron Limited, Minato-ku (JP)

(72) Inventor: Yuichiro Inatomi, Nirasaki (JP)

(73) Assignee: Tokyo Electron Limited, Minato-ku (JP)

( * ) Notice: Subject to any disclaimer, the term of this patent is extended or adjusted under 35 U.S.C. 154(b) by 0 days.

(21) Appl. No.: 13/956,958

(22) Filed: Aug. 1, 2013

(65) Prior Publication Data

US 2013/0312659 A1     Nov. 28, 2013

Related U.S. Application Data

(62) Division of application No. 12/335,965, filed on Dec. 16, 2008, now Pat. No. 8,563,230.

(30) Foreign Application Priority Data

Dec. 17, 2007   (JP) .................................. 2007-324454

(51) Int. Cl.
     *B05C 11/02*      (2006.01)
     *G03F 7/40*      (2006.01)
     *H01L 21/027*      (2006.01)
     *H01L 21/67*      (2006.01)

(52) U.S. Cl.
     CPC ................ *B05C 11/023* (2013.01); *G03F 7/40* (2013.01); *H01L 21/0273* (2013.01); *H01L 21/67028* (2013.01); *H01L 21/67051* (2013.01)

(58) Field of Classification Search
     USPC .............................................. 216/41; 118/66
     See application file for complete search history.

(56) References Cited

U.S. PATENT DOCUMENTS

| | | | |
|---|---|---|---|
| 2001/0035343 A1 | 11/2001 | Kamijima | 204/192.17 |
| 2001/0038988 A1* | 11/2001 | Oda et al. | 432/5 |
| 2006/0237127 A1 | 10/2006 | Inatomi | |
| 2007/0238028 A1 | 10/2007 | Inatomi | |

FOREIGN PATENT DOCUMENTS

| | | |
|---|---|---|
| JP | 2003-21827 | 1/2003 |
| JP | 2003-142261 | 5/2003 |
| JP | 2005-19969 | 1/2005 |
| JP | 2005-310953 | 11/2005 |
| KR | 10-2007-0004866 | 1/2007 |

* cited by examiner

*Primary Examiner* — Daborah Chacko Davis
(74) *Attorney, Agent, or Firm* — Oblon, McClelland, Maier & Neustadt, L.L.P.

(57) ABSTRACT

A solvent vapor is made to adhere efficiently to the surface of a resist pattern without using an ultraviolet irradiation process to improve processing accuracy, to reduce processing time and to suppress the diffusion of the solvent outside a substrate processing system. The surface of a resist pattern R formed on a semiconductor wafer W by an exposure process and a developing process is coated with water molecules m. A solvent vapor of a water-soluble solvent, such as NMP, is spouted on the surface of the resist pattern R coated with the water molecules m. A surface layer of the resist pattern R is swollen by the solvent vapor combined with the water molecules m to achieve a smoothing process. The water molecules m and the solvent s remaining on the resist pattern R on the wafer W after the smoothing process are removed by drying.

4 Claims, 13 Drawing Sheets

SUBSTRATE PROCESSING METHOD AND SUBSTRATE PROCESSING SYSTEM

CROSS-REFERENCE TO RELATED APPLICATIONS

The present application is a divisional application of and claims the benefit of priority from U.S. application Ser. No. 12/335,965, filed Dec. 16, 2008, the entire contents of which are incorporated hereby referenced, and which is based upon and claims the benefit of Japanese Application No. 2007-324454, filed Dec. 17, 2007.

BACKGROUND OF THE INVENTION

1. Field of the Invention

The present invention relates to a substrate processing method of improving the surface condition of a resist 10 film formed in a substrate, such as a semiconductor wafer and a substrate processing system for carrying out the substrate processing method.

2. Description of the Related Art

Usually, a photolithographic process among those 15 for fabricating a semiconductor device includes, a resist film forming process for forming a resist film on a base film formed on, for example, a semiconductor wafer (hereinafter, referred to simply as "wafer") by applying a resist solution to the wafer, an exposure process for exposing the resist film through a mask 20 provided with a circuit pattern to light to form a latent circuit pattern in the resist film, a developing process for processing the exposed resist film by a developer to form a resist pattern, and an etching process for etching the base film formed on the wafer by using the resist pattern as a mask.

A plurality of vertically arranged horizontal ridges and furrows are formed in the side surfaces of a resist pattern R formed by the developing process due to the wave characteristic of the light used for irradiating the surface of the wafer by the exposure process as shown in FIG. 12. For example, the 30 wavelengths of KrF light and ArF light are 248 nm and 193 nm. Those ridges and furrows are LWR lines (line width roughness lines) and LER lines (line edge roughness lines). In a resist pattern R provided with holes H, round ridges and furrows are formed in the side surfaces of the holes H due to the wave 35 characteristic of light used for irradiating the surface of the wafer by the exposure process. When the resist pattern having surfaces roughened by the ridges and furrows are used for etching the base layer by the etching process, ridges and furrows corresponding to those of the resist pattern R are formed in the base film. Consequently, a precise circuit pattern cannot be formed and hence a semiconductor device of a desired quality cannot be produced.

The inventors of the present invention previously proposed a smoothing method (smoothing process) to improve the surface quality of a circuit pattern by smoothing LWR lines and LER lines in JP-A 2005-19969 (Claims and FIGS. 4, 5 and 16). This previously proposed smoothing method dissolves the surfaces of a resist pattern partly in an atmosphere of a solvent for dissolving the resist. Since an ArF resist dissolves in the organic solvent at a low solubility, the resist film is irradiated with ultraviolet light prior to the smoothing process to decompose a dissolution inhibiting protective group, such as a lactone group.

The technique mentioned in JP-A 2005-19969 carries out an ultraviolet-light irradiation process for irradiating the resist pattern with ultraviolet light and a smoothing process for exposing the resist pattern to an atmosphere of a solvent vapor individually by separate devices. Therefore, the time between the ultraviolet-light irradiation process and the smoothing process is not constant and there is the possibility that processing accuracy is not constant. When an ultraviolet-light irradiation device and a smoothing device are used individually, there is a time interval between the ultraviolet-light irradiation process and the smoothing process. Since the smoothing process uses an atmosphere of solvent vapor, it is possible that the solvent absorbed by the resist pattern diffuses through the substrate into and outside the device.

SUMMARY OF THE INVENTION

The present invention has been made in view of the foregoing problems and it is therefore an object of the present invention to provide a substrate processing method capable of improving processing accuracy, reducing processing time and suppressing the diffusion of a solvent into and outside a device by making a solvent vapor adhere efficiently to the surface of a resist pattern without using a ultraviolet-light irradiation process, and a substrate processing system for carrying out the substrate processing method.

The present invention provides a substrate processing method of smoothing the irregular surface of a resist pattern formed on a surface of a substrate by an exposure process and a developing process, including the steps of: executing a pretreatment process for coating the surface of the resist pattern with water molecules; executing a smoothing process for smoothing the surface of the resist pattern by spouting a solvent vapor of a water-soluble solvent capable of dissolving a resist forming the resist pattern on the surface of the resist pattern to swell a surface layer of the resist pattern; and executing a posttreatment process for removing the water molecules and the solvent remaining on the smoothed surface of the resist pattern formed on the substrate by drying.

Possible solvent vapors may be those of N-methyl-2-pyrolidone (NMP), acetone, and propylene glycol monomethyl ether acetate (PGMEA). A NMP vapor is suitable for processing a resist film irradiated with light having a wavelength of 193 nm emitted by an ArF light source.

The pretreatment process included in the substrate processing method of the present invention may be carried out at an ordinary temperature, provided that water molecules can adhere to the surface of the resist pattern on the substrate at an ordinary temperature. However, it is preferable to subject the cooled substrate to the pretreatment process.

Preferably, the substrate processing method further includes the step of executing a water molecule spraying process for spraying water molecules on the surface of the resist pattern to entice the water molecules and the solvent adhering to, the surface of the resist pattern to come off. The water molecule spraying process is executed before drying the resist pattern by the posttreatment process.

In the posttreatment process included in the substrate processing method of the present invention, the substrate may be rotated about a vertical axis or the substrate may be heated.

The present invention provides a substrate processing system for smoothing the irregular surface of a resist pattern formed on a surface of a substrate by an exposure process and a developing process including: a substrate holding table for holding a substrate thereon with a surface of the substrate facing up; a water molecule spraying nozzle for spraying water molecules on a surface of the resist pattern on the substrate; a solvent vapor spouting nozzle for spouting a solvent vapor of a water-soluble solvent onto the surface of the resist pattern on the substrate; and a drying means for removing the water molecules and the solvent adhering to the surface of the resist pattern.

The substrate holding table included in the substrate processing system may be provided with a cooling means for cooling the substrate.

The drying means included in the substrate processing system is a rotational driving device for rotating the substrate holding table about a vertical axis or a heating device provided with a hot plate for supporting the substrate thereon.

According to the present invention, water molecules are made to adhere to the surface of the resist pattern on the substrate, and then the solvent vapor of the water-soluble solvent is spouted on the surface of the resist pattern coated with the water molecules. Then, the solvent vapor combines with the water molecules and spreads uniformly over the surface of the resist pattern to swell the surface of the resist pattern. Consequently, the irregular surface of the resist pattern can be smoothed. The water molecules and the solvent remaining on the resist pattern on the substrate after the surface of the resist pattern has been smoothed are removed by drying to remove the solvent from the substrate.

According to the present invention, water molecules spread over the surface of the resist pattern on the substrate after cooling the substrate. Thus, water molecules condense on and adhere closely to the surface of the resist pattern.

According to the present invention, water molecules are sprayed on the surface of the resist pattern to entice the water molecules and the solvent adhering to the surface of the resist pattern to come off before drying the resist pattern by the posttreatment process. Thus, the solvent adhering to the resist pattern combines with the water molecules and is removed together with the water molecules from the resist pattern.

According to the present invention, the water molecules and the solvent adhering to the resist pattern can be removed by centrifugal force by rotating the substrate about a vertical axis.

According to the present invention, the water molecules and the solvent adhering to the resist pattern can be removed by heating the substrate to evaporate the water molecules and the solvent adhering to the resist pattern. The resist swollen during the smoothing process can be hardened and the chemical resistance thereof can be improved by heating the substrate.

The substrate processing method and the substrate processing system of the present invention thus constituted have the following effects.

(1) Since the solvent vapor can be uniformly spread over the surface of the resist pattern to swell the surface of the resist pattern and the irregular surface of the resist pattern can be smoothed, processing accuracy can be improved, the substrate processing method and the substrate processing system can smooth the resist pattern in a short processing time as compared with the substrate processing method and the substrate processing system that process the substrate by an ultraviolet-light irradiation process.

(2) Since the pretreatment process condenses water molecules on and adhere to the surface of the resist pattern, the solvent vapor can surely cover the surface of the resist pattern and processing accuracy can be improved still further.

(3) Since the posttreatment process makes the solvent adhering to the resist pattern combine with the water molecules and removes the solvent together with the water molecules from the resist pattern, the solvent adhering to the resist pattern can be surely removed and the diffusion of the solvent in and outside the system can be surely suppressed.

(4) Since the water molecules and the solvent adhering to the resist pattern can be removed by centrifugal force by rotating the substrate about a vertical axis, the smoothing process and the posttreatment process (drying process) can be successively carried out in the same device and the processing time can be reduced still further.

(5) Since the water molecules and the solvent adhering to the resist pattern can be removed by heating the substrate to evaporate the water molecules and the solvent adhering to the resist pattern and the resist swollen during the smoothing process can be hardened and the chemical resistance thereof can be improved by heating the substrate.

DESCRIPTION OF THE PREFERRED EMBODIMENTS

Preferred embodiments of the present invention will be described with reference to the accompanying drawings. A substrate processing system according to the present invention will be described as applied to a coating and developing system.

Figure 1:
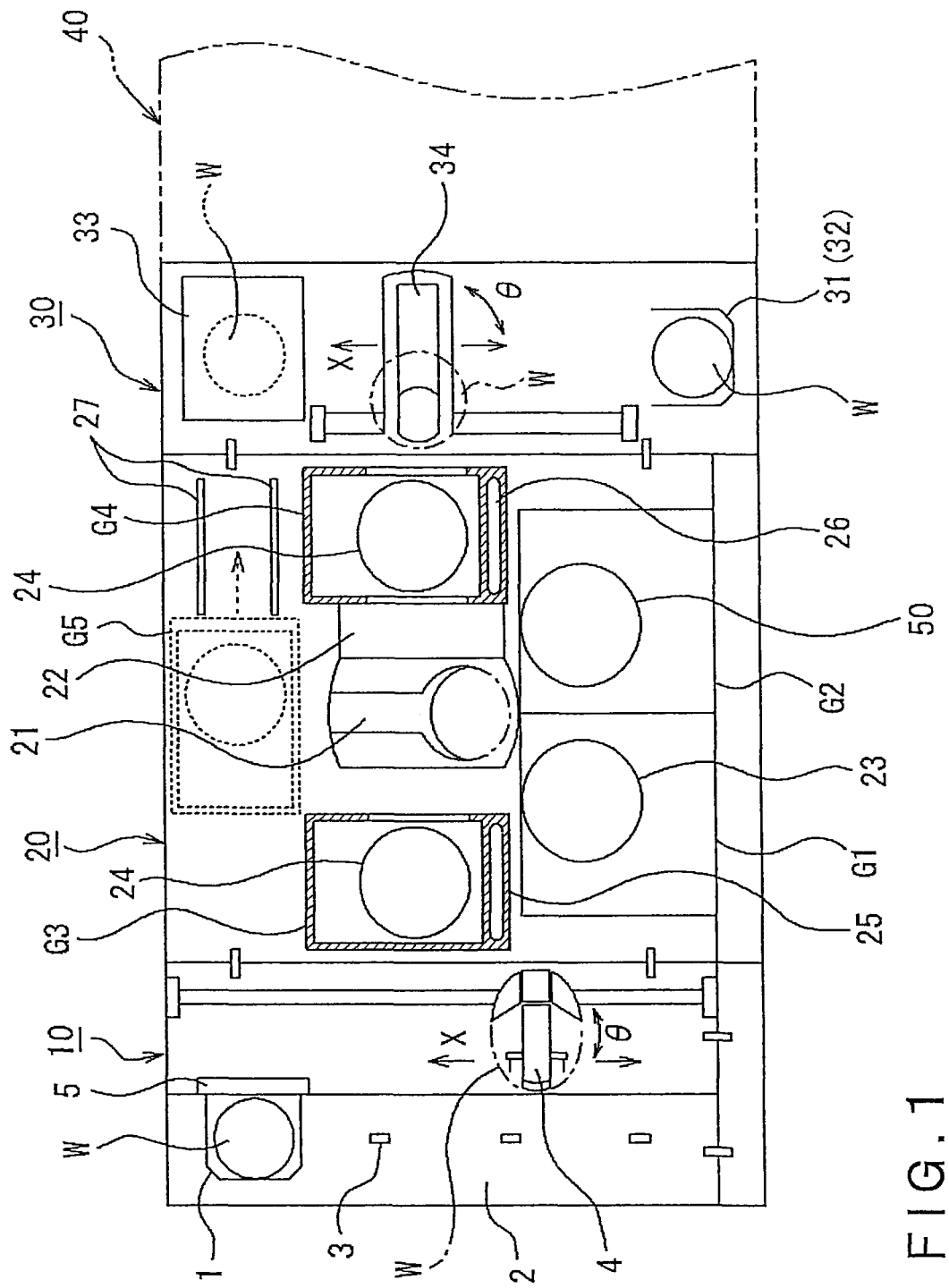
FIG. 1 is a schematic plan view showing a coating and developing system including a substrate processing system according to the present invention by way of example.
Figure 2:
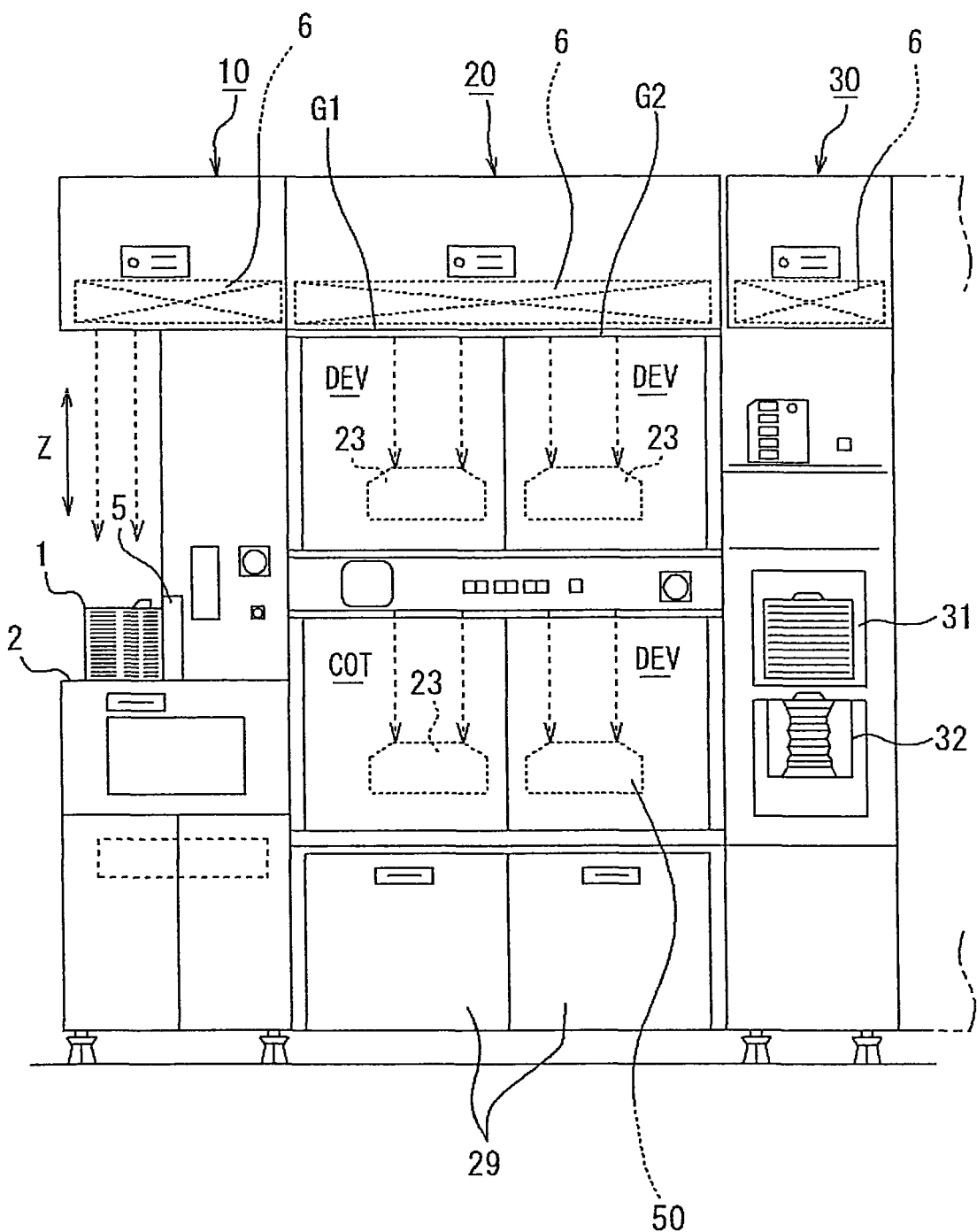
FIG. 2 is a schematic front elevation of the coating and developing system.
Figure 3:
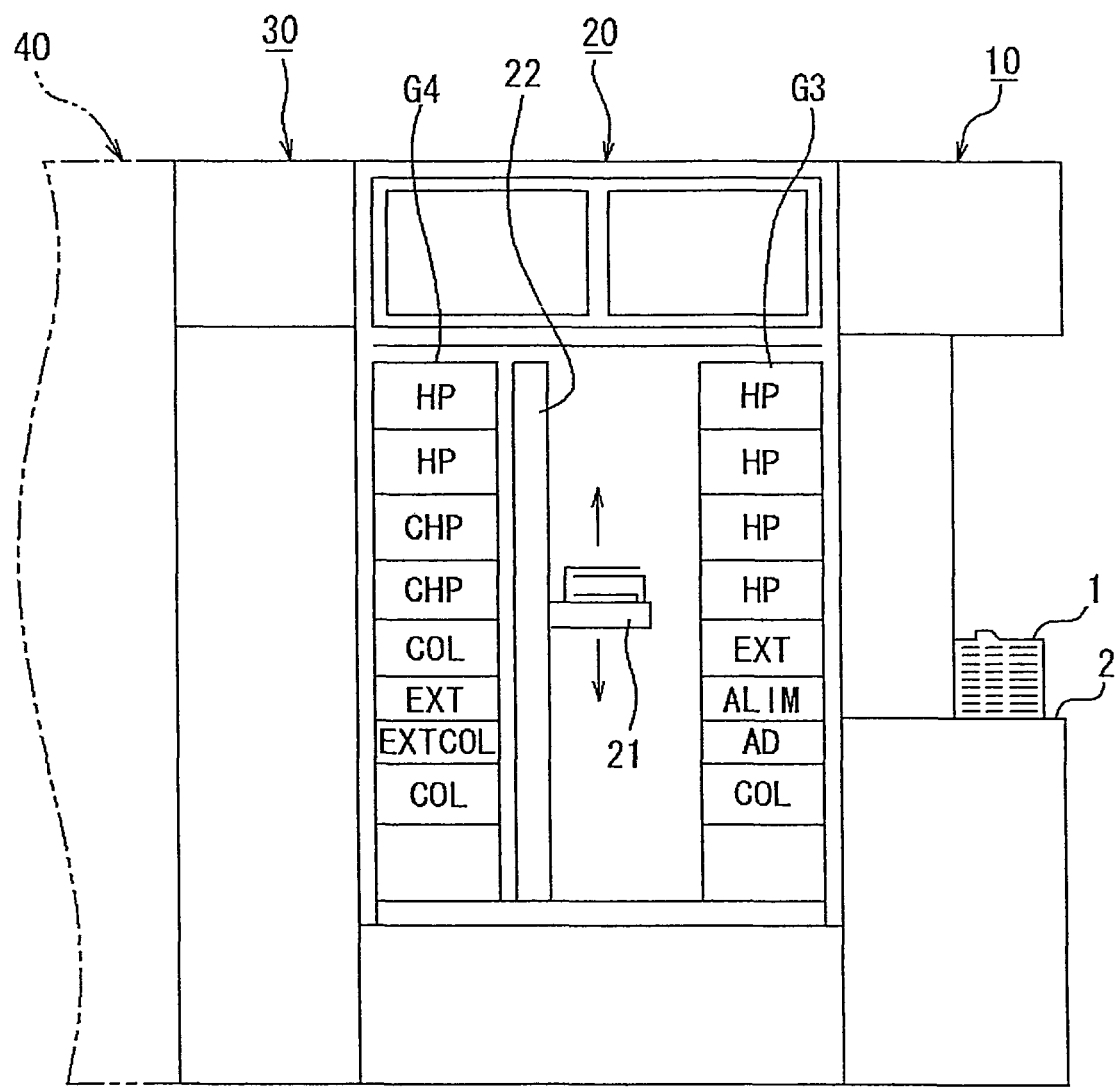
FIG. 3 is a schematic rear view of the coating and developing system.

FIG. 1 is a schematic plan view showing a coating and developing system including a substrate processing system according to the present invention by way of example, FIG. 2 is a schematic front elevation of the coating and developing system shown in FIG. 1, and FIG. 3 is a schematic rear view of the coating and developing system shown in FIG. 1.

The coating and developing system includes, as principal components, a cassette station 10, a processing station 20, and an interface unit 30. The cassette station 10 receives and sends out a wafer cassette 1 containing a plurality of wafers W, e.g., twenty-five wafers W, and takes out a wafer W from and delivers a wafer W to the cassette 1. The processing station includes various types of processing units disposed at predetermined positions in a layered arrangement for processing one wafer W at a type in a single-wafer processing mode. The interface unit 30 is interposed between the processing station and an exposure system 40 to transfer a wafer W between the processing station 20 and the exposure system 40.

Referring to FIG. 1, in the cassette station 10, a plurality of wafer cassettes 1, e.g., four wafer cassettes 1 at the most, are arranged horizontally in an X-direction with their open sides covered with a lid facing the processing station 20. Lid opening devices 5 are arranged opposite to the wafer cassettes 1, respectively. A wafer carrying arm 4 can move in the horizontal X-directions and vertical Z-directions in which wafers W are arranged in layers in the wafer cassette 1, and can turn in a θ-direction. The wafer carrying arm 4 accesses each of the wafer cassettes 1 selectively to take out a wafer W from and to put a wafer W into the cassette 1. Thus, the wafer carrying arm 4 can carry a wafer to an alignment unit ALIM and an extension unit EXT included in a third multilayer group G3 installed in the processing station 20.

Referring to FIG. 1, a main wafer carrying mechanism 21 is installed in a central area of the processing station 20. The main wafer carrying mechanism 21 is moved vertically by a moving mechanism 22. All the processing units of one or a plurality of groups are arranged in a vertically layered arrangement and the groups are arranged around the main wafer carrying mechanism 21. In this embodiment, the processing station 20 has five groups, namely, a first group G1, a second group G2, a third group G3, a fourth group G4 and a fifth group G5. The first group G1 and the second group G2 are arranged in the front part of the coating and developing system, the third group G3 is disposed near the cassette station 10, the fourth group G4 is disposed near the interface unit 30, and the fifth group G5 is disposed in a rear part of the of the coating and developing system.

Referring to FIG. 2, a coating unit COT and a developing unit DEV are stacked one on top of the other in two layers in the first group G1. The coating unit COT processes a wafer W held by a spin chuck, not shown, in a processing cup 23, namely, processing vessel 23, by a predetermined process. The developing unit DEV develops a latent resist pattern formed in a resist film by a developing device, not shown, in a processing cup 23, namely, a processing vessel 23. In the second group G2, developing units DEV are stacked one on top of the other in two layers. One of the developing units DEV of the second group G2 is provided with a smoothing system 50, namely, a substrate processing system according to the present invention. The coating unit COT and the smoothing system 50 are in the lower layers of the groups G1 and G2, respectively, because such an arrangement of the coating unit COT and the smoothing system 50 simplifies mechanisms for draining a resist solution and discharging a solvent contained in the resist solution and facilitates maintenance work. When necessary, the coating unit COT and the smoothing system 50 may be placed in the upper layers of the groups G1 and G2, respectively.

Referring to FIG. 3, the third group G3 is formed by stacking up a cooling unit COL, and adhesion promoting unit AD, an alignment unit ALIM, an extension unit EXT and four hot plate units HP in that order. The cooling unit COL cools a wafer W placed on a support table 24. The adhesion promoting unit AD processes a wafer by an adhesion promoting process. The alignment unit ALIM sets a wafer W in correct alignment. The extension unit EXT receives and sends out a wafer W. The hot plate units HP process a wafer W by a heat-treatment process.

The fourth group G4 is formed by stacking up a cooling unit COL, an extension cooling unit EXTCOL, an extension unit EXT, a cooling unit COL, two chilling hot plate units CHP each provided with a heat-treatment device having a quenching function, and two hot plate units HP each provided with a heat-treatment device in that order.

The cooling units COL and the extension cooling unit EXTCOL, which use a low processing temperature, are placed in lower layers and the hot plate units HP, the chilling hot plate unit (CHP and the adhesion promoting unit AD, which use a high processing temperature to reduce thermal interference between those units. Naturally, those units may be arranged in any suitable arrangement other than that shown in FIG. 3.

Vertical ducts 25 and 26 are incorporated into side walls of the third group G3 and the fourth group G4, namely, open type processing units, adjacent to the first group G1 and the second group G2, namely, spinner type processing units, respectively, as shown in FIG. 1. Clean air or air maintained at a special temperature flows down in the ducts 25 and 26. The spinner type processing units of the first group G1 and the second group G2 are isolated from heat generated by the open type processing units of the third group G3 and the fourth group G4 by the ducts 25 and 26.

The coating and developing system includes a fifth group G5 of processing units stacked up in layers disposed behind the main wafer carrying mechanism 21 as indicated by dotted lines in FIG. 1. The processing units of the fifth group G5 can move sideways as viewed from the main wafer carrying mechanism 21 along guide rails 27. A vacant space is formed behind the main wafer carrying mechanism 21 by moving the processing units of the fifth group G5 disposed behind the main wafer carrying mechanism 21 along the guide rails 27 to facilitate carrying out maintenance work for the main wafer carrying mechanism 21 from behind the main wafer carrying mechanism 21. A chemical unit 29 including tanks containing, for example, a resist solution, a developer and resist dissolving solvent, and pipes connected to those tanks is disposed in a lower part of the processing station 20.

The interface unit 30 has a dimension in the X-direction, namely, width, equal to that of the processing station 20 and a dimension in a direction perpendicular to the X-direction, namely, length, smaller than that of the processing unit 20. A portable pickup cassette 31 and a stationary buffer cassette 32 are disposed one on top of the other in a front part of the interface unit 30. An edge exposure device 33 for processing a peripheral part and an identification mark area on a wafer W is disposed in a rear part of the interface unit 30. A wafer carrying arm 34, namely, a carrying means, is disposed in a middle part of the interface unit 30. The wafer carrying arm 34 moves in the X-directions and the Z-directions to carry a wafer from and to the pickup cassette 31, the buffer cassette 32 and the edge exposure device 33. The wafer carrying arm 34 can turn in the θ-direction to access the extension unit EXT of the fourth group G4 and a transfer stage, not shown, of the adjacent exposure system 40 to carry a wafer from and to the extension unit EXT and the transfer stage.

The coating and developing system is installed in a cleanroom. The coating and developing system is provided with HEPA filters 6 on its ceiling to enhance the cleanliness of the atmosphere in the coating and developing system by supplying clean air by an efficient vertical laminar flow method.

The smoothing system 50 will be described with reference to FIGS. 4 to 6.

Figure 4:
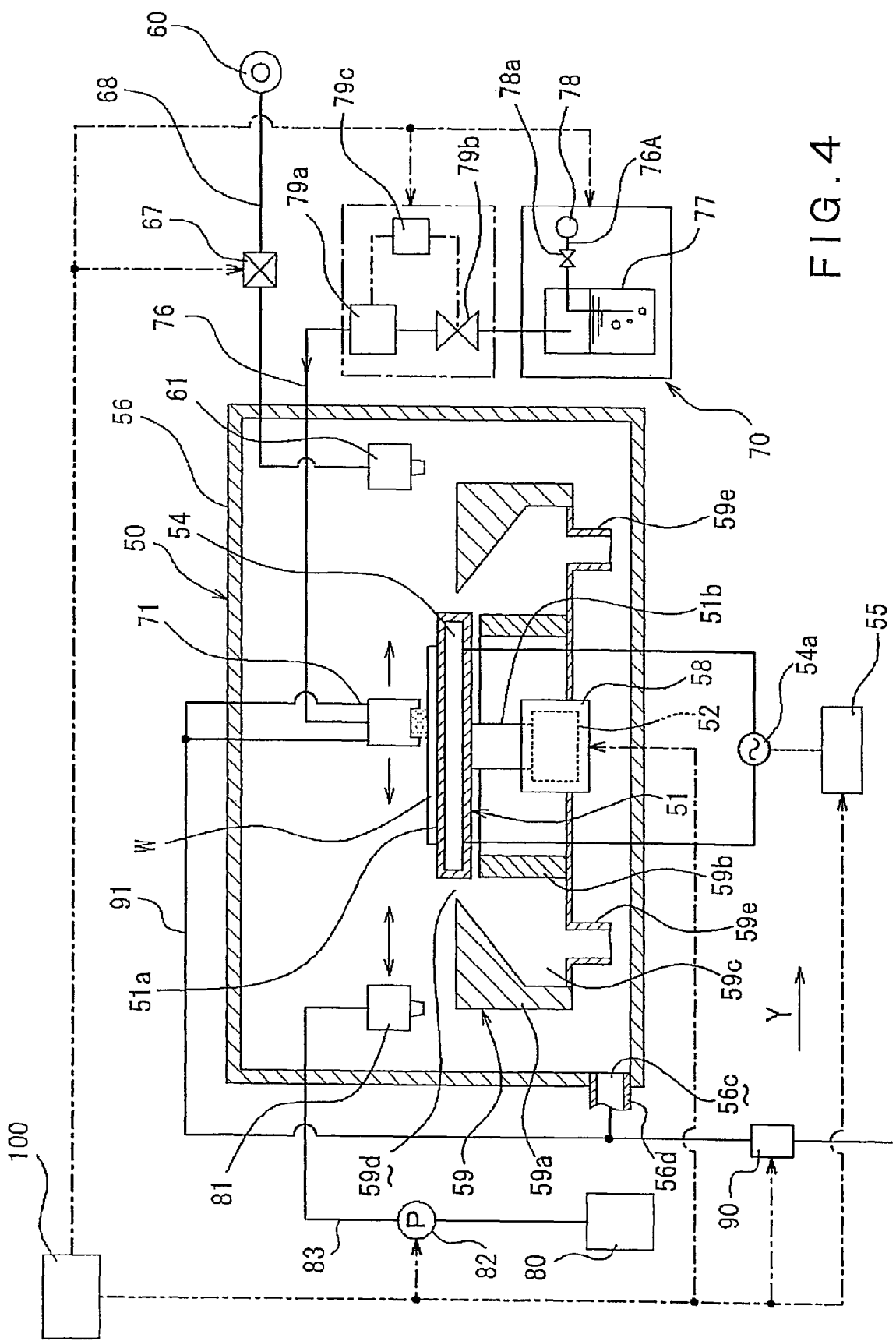
FIG. 4 is a schematic longitudinal sectional view of a substrate processing system in a first embodiment according to the present invention.
Figure 5:
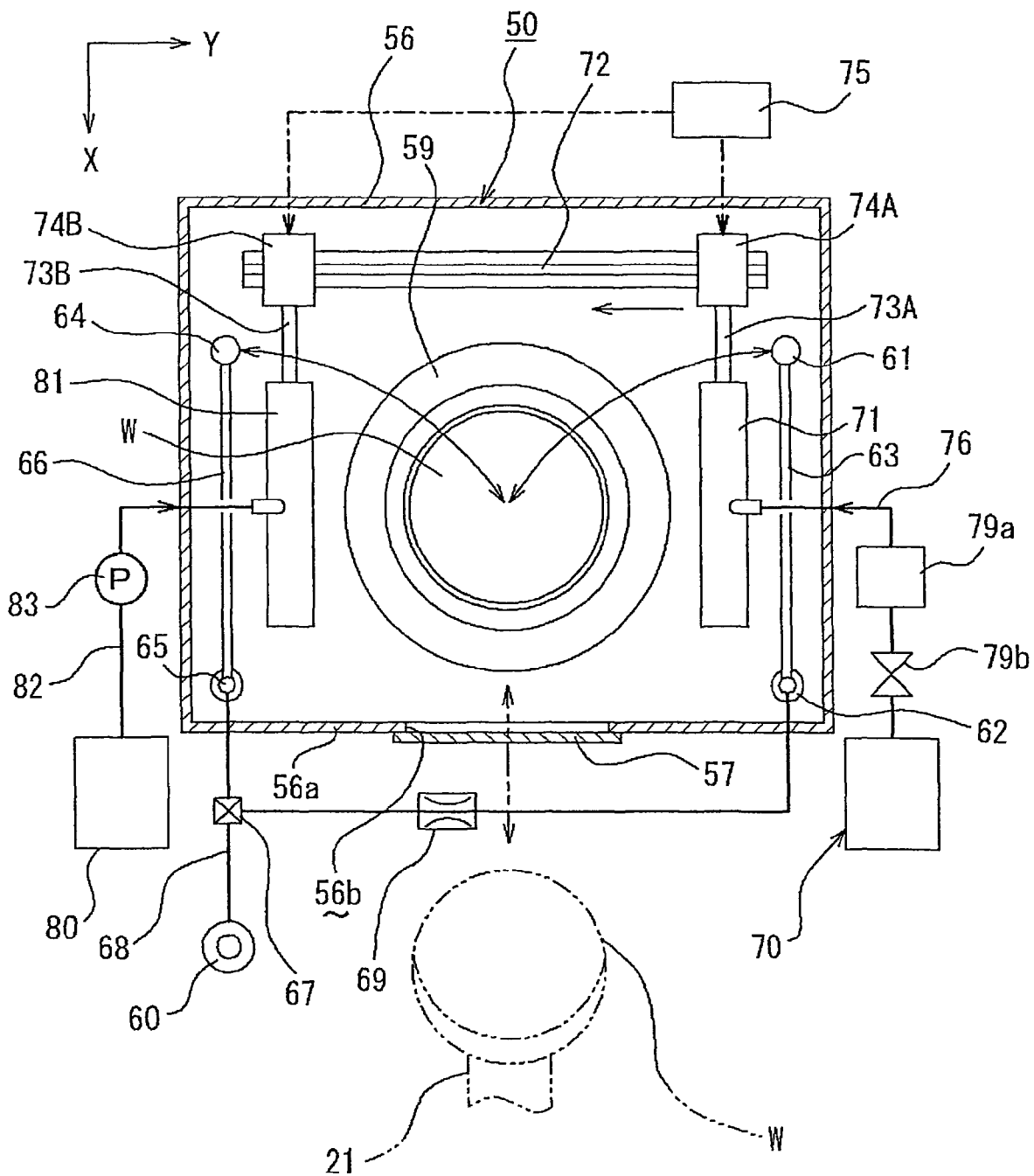
FIG. 5 is a schematic cross-sectional view of the substrate processing system shown in FIG. 4.

FIG. 4 is a schematic longitudinal sectional view of the smoothing system 50, namely, a substrate processing system in a first embodiment according to the present invention and FIG. 5 is a schematic cross-sectional view of the smoothing system 50 shown in FIG. 4.

Referring to FIGS. 4 and 5, the smoothing system 50 has a chuck 51, namely, a substrate holding table, installed in a central part of a box 56. An upper, circular holding surface 51a of the chuck 51 is horizontal and has a diameter approximately equal to that of a wafer W. The holding surface 51a of the chuck 51 is provided with a plurality of suction holes, not shown, to attract a wafer W to the holding surface 51a by suction. The chuck 51 has a shaft 51b connected to a motor 52, namely, a rotational driving device. The motor 52 drives the shaft 51b for rotation to rotate the chuck 51 about a vertical axis. A solvent and moisture adhering to a wafer can be removed by a spin drying method by rotating the chuck 51 holding the wafer W thereon by the motor 52. The chuck 51 can be vertically moved by a lifting mechanism 58 to transfer a wafer W between the chuck 51 and the main wafer carrying mechanism 21.

The chuck 51 having the holding surface 51a is internally provided with a Peltier element 54. A power supply 54a is connected to the Peltier element 54. Heat is evolved or absorbed at the pn-junction carrying a current in the Peltier element 54, depending upon the direction of the current. Such a thermal effect of the Peltier element 54 is used for adjusting the temperature of a wafer W placed on the holding surface 51a selectively to a desired temperature, such as 5° C. for cooling or 23° C. for a developing process.

An opening 56b is formed in one side wall 56a of the box 56. A wafer W is carried into and carried out of the box 56 through the opening 56b. A shutter 57 is disposed at the opening 56b. The shutter 57 is operated by a shutter operating mechanism, not shown, to open and close the opening 56b. An exhaust port 56c is formed in a lower part of a side wall of the box 56 and is connected to an exhaust pump 90, namely, an exhaust means, by an exhaust pipe 56d.

The chuck 51 is surrounded by, for example, an exhaust cup 59. For example, the upper end of the exhaust cup 59 is at a level lower than that of the holding surface 51a of the chuck 51. For example, the exhaust cup is a double-wall structure including an outer cup 59a and an inner cup 59b. The outer cup 59a and the inner cup 59b define an exhaust passage 59c. An annular suction opening 59d is formed between the respective upper ends of the outer cup 59a and the inner cup 59b. As shown in FIG. 4, the suction opening 59d surrounds the holding surface 51a. Parts of a space between the respective lower ends of the outer cup 59a and the inner cup 59b are connected to an exhaust system, not shown, by exhaust pipes 59e. An atmosphere over the chuck 51 is sucked through the suction opening 59d into the cup 59 and is removed from the cup 59.

Referring to FIG. 5, rails 72 is disposed on one side of the cup 59 (a side on the side of the negative X-direction, namely, the upper side as viewed in FIG. 5) so as to extend in a Y-direction, namely, a lateral direction. The rails 72 are extended beyond the diametrically opposite ends of the cup 59. Drive units 74A and 74B respectively holding arms 73A and 73B move along the rails 72. A solvent vapor spouting nozzle 71 for spouting a solvent vapor on a wafer W (hereinafter, referred to simply as "solvent spouting nozzle 71") and a developer spraying nozzle 81 for spraying a developer on a wafer W are held on the arms 73A and 73B, respectively.

The solvent spouting nozzle 71 and the developer pouring nozzle 81 can move along the rails 72 from a position outside one of the diametrically opposite ends of the cup 59 over the chuck 51 to a position outside the other of the diametrically opposite ends of the cup 59. For example, a drive unit controller 75 controls the drive units 74A and 74B to control the movement of the solvent spouting nozzle 71 and the developer pouring nozzle 81. The drive unit controller 75 can move the solvent spouting nozzle 71 and the developer pouring nozzle 81 at predetermined speed in the Y-directions. For example, the drive units 74A and 74B are provided with cylinder actuators for vertically moving the arms 73A and 73B, respectively, to adjust the respective distances of the solvent spouting nozzle 71 and the developer pouring nozzle 81 from the holding surface 51a. In this embodiment, the rails 72, the arms 73A and 73B, the drive units 74A and 74B, and the drive unit controller 75 constitute a moving mechanism.

A water molecule spraying nozzle 61 (hereinafter, referred to as "mist nozzle 61") is placed in the box 56. The mist nozzle 61 sprays water molecules, such as pure water molecules, in mist on a resist pattern formed on a wafer W. The mist nozzle 61 is attached to one end of an arm 63 having the other end connected to a rotational drive unit 62. As shown in FIG. 5, the mist nozzle 61 can be moved along a circular path between a home position and a position above the center of the wafer W. Thus the surface of the resist pattern can be wetted with pure water molecules by spraying mist of pure water on the wafer W by the mist nozzle 61 prior to a smoothing process.

A cleaning nozzle 64 is placed in the box 56. The cleaning nozzle 64 sprays water molecules, such as pure water molecules, on the resist pattern formed on the wafer W. The cleaning nozzle 64 is attached to one end of an arm 66 having the other end connected to a rotational drive unit 65. As shown in FIG. 5, the cleaning nozzle 64 can be moved along a circular path between a home position and a position above the center of the wafer W. Thus, pure water molecules, namely, a cleaning liquid, can be supplied onto the wafer W after a developing process.

The mist nozzle 61 and the cleaning nozzle 64 are connected to a pure water source 60 by a pure water molecules supply pipe 68 provided with a selector valve 67. An orifice 69 is placed in a pipe connecting the mist nozzle 61 to the secondary side of the selector valve 67.

Figure 6A:
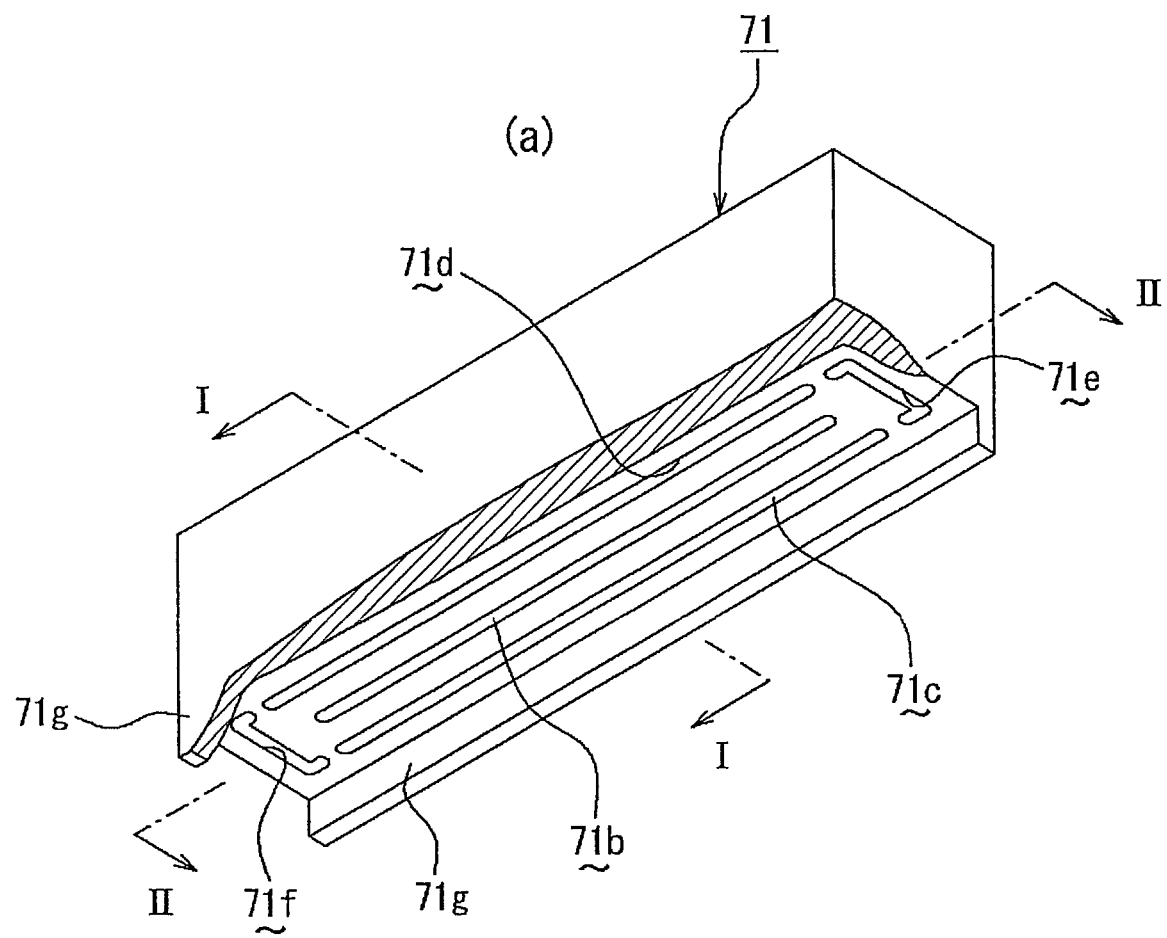
FIG. 6A is a perspective view of a solvent vapor jetting nozzle according to the present invention.
Figures 6B, 6C:
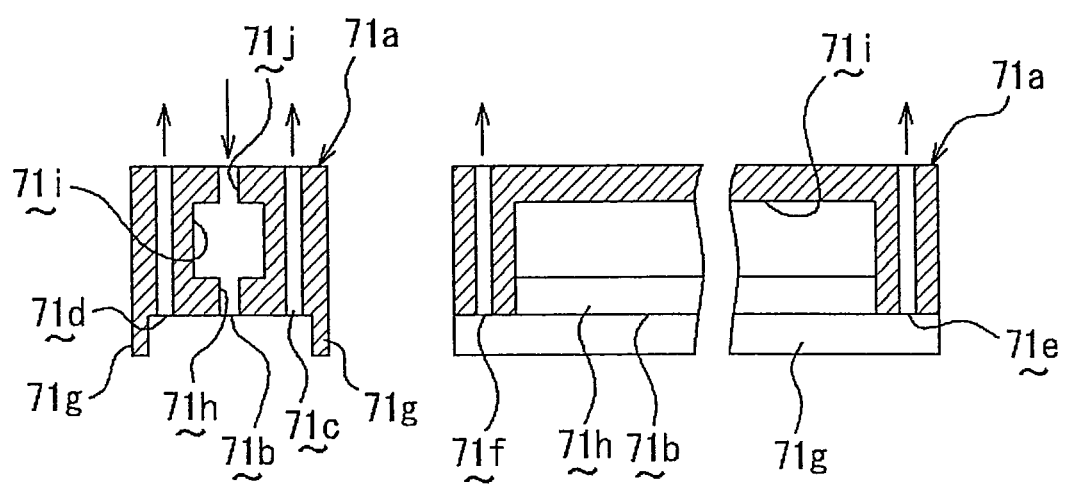
FIG. 6B is a sectional view taken on the line I-I in FIG. 6A.
FIG. 6C is a sectional view taken on the line II-II in FIG. 6A.

Referring to FIG. 6, the solvent spouting nozzle 71 has a rectangular nozzle head 71a of a length greater than the diameter of a wafer W. A discharge slit 71b is extended longitudinally in a middle part of the lower surface of the nozzle head 71a. Four solvent vapor exhausting slits 71c, 71d, 71e and 71f are formed around the discharge slit 71b. Blocking walls 71g extend down at least from the opposite long sides of the lower surface of the nozzle head 71a. The blocking walls 71g prevents the effluence of a solvent vapor outside a working space. As shown in FIGS. 6B and 6C, the nozzle head 71a is provided with a solvent vapor accumulating space 71i communicating with the discharge slit 71b by means of a connecting passage 71h. A supply port 71j opening into the solvent vapor accumulating space 71i is connected to a solvent vapor source 70 by a solvent vapor supply pipe 76. The exhaust slits 71c, 71d, 71e and 71f is connected to an exhaust pump 90, namely, an exhaust means, by an exhaust pipe 91.

The solvent vapor source 70 has a storage tank 77 for producing a solvent vapor storing a liquid solvent and connected, for example, to the solvent vapor supply pipe 76, and a nitrogen gas supply pipe 76A connected to a nitrogen gas source 78, namely, an inert gas source. Nitrogen gas ($N_2$) is supplied through the nitrogen gas supply pipe 76A into the storage tank 77 to supply the solvent vapor by pressure. The nitrogen gas supply pipe 76A is provided with a flow regulating valve 78a. Nitrogen gas is supplied through the nitrogen gas supply pipe 76a into the liquid solvent contained in the storage tank 77 to force a solvent vapor produced in the storage tank 77 into the solvent vapor supply pipe 76 by pressure. Thus the solvent vapor is supplied through the solvent vapor supply pipe 76 to the solvent spouting nozzle 71. The solvent may be, for example, water-soluble N-methyl-2-pyrolidone (NMP), acetone or propylene glycol monomethyl ether acetate (PGMEA).

The solvent vapor supply pipe 76 is provided with a flow meter 79a for measuring the flow rate of the solvent vapor and a flow regulating valve 79a for regulating the flow of the solvent vapor. A flow rate measured by the flow meter 79a is given to a flow controller 79c. The flow controller 79c regulates the opening of the flow regulating valve on the basis of the measured flow rate such that the solvent vapor is discharged through the solvent spouting nozzle 71 at a predetermined discharge rate. The flow controller 79c is electrically connected to a main controller 100, namely, a control means. The flow controller 79c adjusts the flow of the solvent vapor on the basis of a control signal given thereto by the main controller 100.

The developer pouring nozzle 81 is connected to a developer source 80 by a developer supply pipe 83 provided with a pump 82. The pump 82 pumps the developer from the developer source 80 into the developer pouring nozzle 81.

In the smoothing system 50, the motor 52, a temperature controller 55, the lifting mechanism 58, the rotational drive units 62 and 65, the selector valve 67, the drive unit controller 75, the flow regulating valve 78a, the flow controller 79c, the pump 82 and the exhaust pump 90 are electrically connected to the main controller 100. Those components electrically connected to the main controller 100 are controlled by control signals provided by the main controller 100 as shown in FIG. 4. The main controller 100 operates according to a program previously stored therein to execute a developing process by pouring the developer onto a wafer W through the developer pouring nozzle 81, a cleaning process by pouring a cleaning liquid (pure water molecules) through the cleaning nozzle 64 onto the wafer W, a pretreatment process preceding a smoothing process by spraying pure water mist through the mist nozzle 61 on the a resist pattern formed on a surface of the wafer processed by an exposure process, a smoothing process by spouting the solvent vapor on the resist pattern wetted with pure water molecules, and a posttreatment process succeeding the smoothing process by rotating the wafer W at a high rotating speed by the motor 52 to remove the solvent and the pure water molecules adhering to the resist pattern by a spin drying method.

Figure 7A:
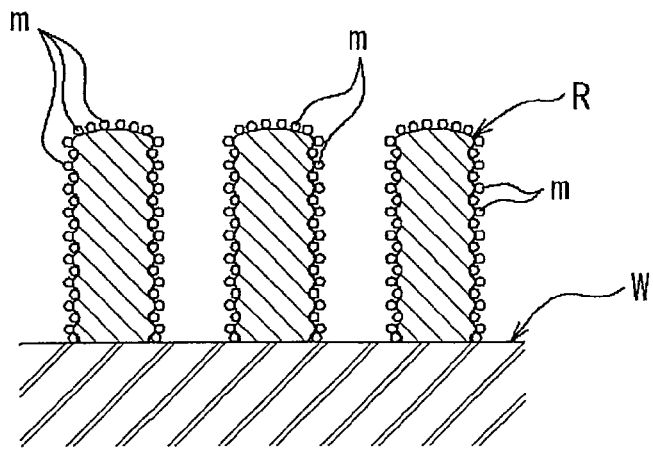
FIG. 7A is a schematic sectional view of a resist pattern in a pretreatment process preceding a smoothing process.

The pretreatment process, the smoothing process and the posttreatment process will be described with reference to FIG. 7. The pretreatment process sprays pure water mist by the mist nozzle 61 on the surface of a resist pattern R formed by processing a wafer W by a developing process to cover the surface of the resist pattern R with water molecules m as shown in FIG. 7A. The motor 52 drives the chuck 51 to rotate the wafer W in a horizontal plane during the pretreatment process so that the water molecules m are distributed uniformly over the surface of the resist pattern R. A current is supplied to the Peltier element 54 in a direction such that heat is absorbed to cool the holding surface 51a of the chuck 51 to cool the wafer W. Consequently, the water molecules m condense on and adhere closely to the resist pattern R.

Figure 7B:
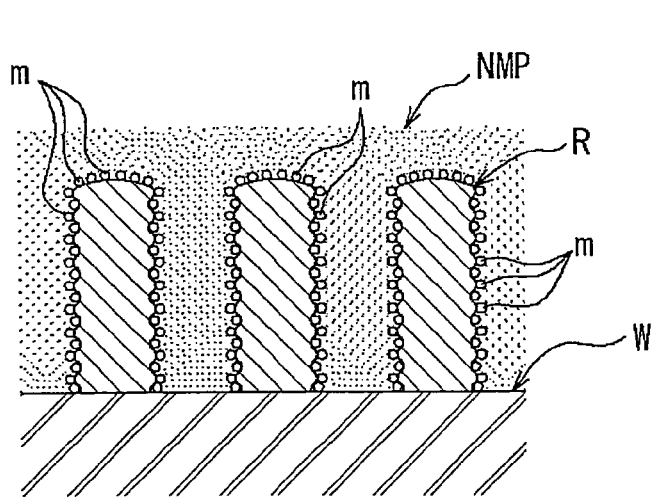
FIG. 7B is a sectional view of the resist pattern in the smoothing process.
Figure 7C:
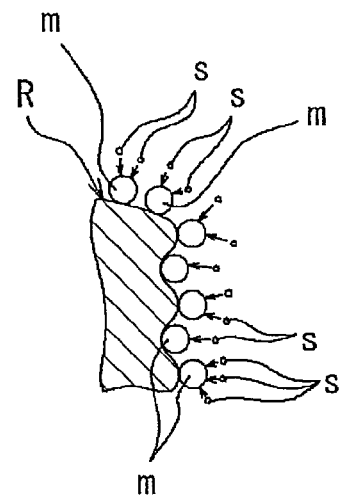
FIG. 7C is an enlarged, fragmentary sectional view of the resist pattern.

Subsequently, the solvent spouting nozzle 71 is moved from a position outside the cup 59 to a position above a first end of the wafer W. An operation for discharging the atmosphere in the cup 59 is stopped temporarily and the solvent spouting nozzle starts spouting the solvent vapor at a fixed spouting rate. After the solvent vapor has been thus spouted on a predetermined area of in the first end of the surface of the wafer W and the solvent spouting nozzle has started spouting the solvent vapor, the solvent spouting nozzle 71 starts moving toward a second end diametrically opposite the first end of the wafer W at a fixed speed. Thus, a solvent vapor supply area on the surface of the wafer W moves toward the second end of the wafer W. Upon the arrival of the solvent spouting nozzle 71 at a position above the second end of the wafer W, the solvent spouting nozzle 71 starts moving from the second end toward the first end of the wafer W. Thus, the solvent spouting nozzle 71 goes and returns between the first and the second end of the wafer W to spout the solvent vapor, such as a NMP vapor, on the surface of the resist pattern R on the wafer W to achieve the smoothing process as shown in FIG. 7B.

Figure 7D:
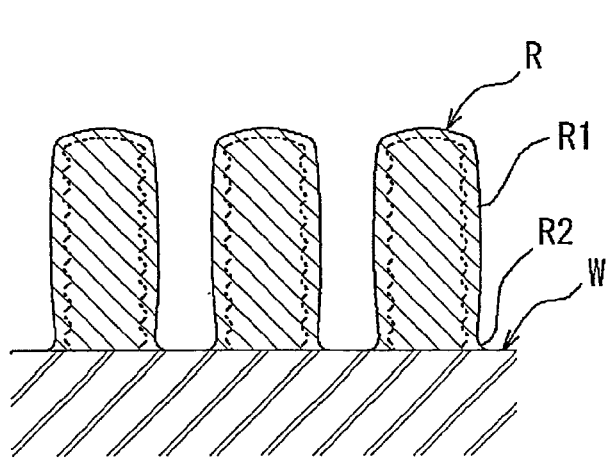
FIG. 7D is a schematic sectional view of the resist pattern processed by the smoothing process.

When the surface of the resist pattern R is thus coated with the solvent vapor, the water molecules m combine with the solvent s of the solvent vapor (NMP vapor). The solvent combined with the water molecules m dissolve only a surface layer of the resist pattern R and cause side walls R1 and corner parts R2 of the resist pattern R to sell as shown in FIG. 7D. The moving speed of the solvent spouting nozzle 71, the spouting rate at which the solvent spouting nozzle 71 spouts the solvent vapor, the solvent concentration and the temperature of the solvent vapor are experimentally determined beforehand so that only the surface layer of the resist pattern R may be dissolved.

During the smoothing process, the exhaust pump 90 is operated to remove the remaining solvent vapor through the solvent vapor exhausting slits 71c, 71d, 71e and 71f. Thus the diffusion of the solvent vapor outside the solvent spouting nozzle 71 can be suppressed.

Figure 7E:
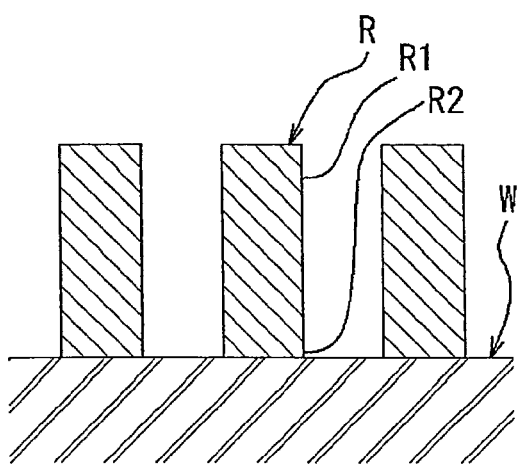
FIG. 7E is a schematic sectional view of the resist pattern in a posttreatment process.

After the completion of the smoothing process, the posttreatment process is executed. The posttreatment process rotates the wafer W at a high rotating speed by the motor 52 to remove the solvent s and the water molecules m adhering to the resist pattern R and to dry the resist pattern R by spin drying as shown in FIG. 7E. The surface of the resist pattern R is smooth after the completion of the posttreatment process.

Although the smoothing system 50 of the present invention has been described as incorporated into the developing unit DEV, the smoothing system 50 may be an independent system.

Figure 8:
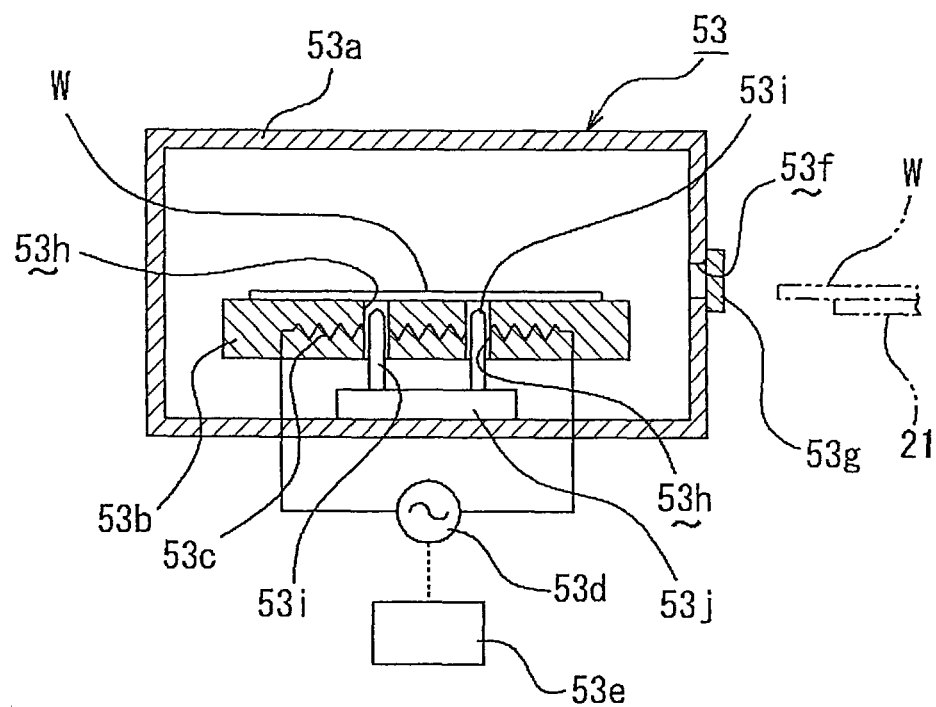
FIG. 8 is a schematic sectional view of a heating device included in a substrate processing system in a second embodiment according to the present invention.

In the foregoing description, the solvent s and the water molecules m adhering to the resist pattern R are removed and the resist pattern R is dried by spin drying by rotating the wafer W at a high rotating speed by the motor 52. The resist pattern may be dried by heating by a heating device instead of by spin drying. As shown in FIG. 8 by way of example, a heating unit 53, namely, a heating device, is provided with a heating plate 53b installed in a box 53a. The wafer W is placed on and is heated by the heating plate 53b. The heating plate 53b is internally provided with an electric heater 53c that generates heat when a current is supplied thereto. A heater controller 53e controls a power supply 53d for the heater 53c. The heater controller 53e is electrically connected to the main controller 100. The heater controller 53e regulates the heat generating rate of the heater 53c on the basis of a control signal given thereto by the main controller 100 to control the temperature of the heating plate 53b. An opening 53f is formed in one side wall of the box 53a. A wafer W is carried into and carried out of the box 53a through the opening 53f. A shutter 53g is disposed at the opening 53f. The shutter 53g is operated by a shutter operating mechanism, not shown, to open and close the opening 53f.

Vertical through holes 53h are formed in a central part of the heating plate 53b, and lifting pins 53i are inserted in the through holes 53h from below. The lifting pins 53i are moved vertically by a lifting mechanism 53j so as to project upward from the surface of the heating plate 53b. Thus, the wafer W can be transferred between, for example, the main wafer carrying arm 21 and the heating plate 53b by lifting up the wafer W by the lifting pins 53i.

The wafer W carrying the resist pattern R having the surface layer swollen by the smoothing process is placed on the heating plate 53b of the heating unit 53. The solvent s and the water molecules m adhering to the resist pattern is vaporized by heat generated by the heater 53c. Thus the solvent s and the water molecules m are removed from the resist pattern R and the swollen resist pattern R is dried and hardened to improve chemical resistance.

Figure 9A:
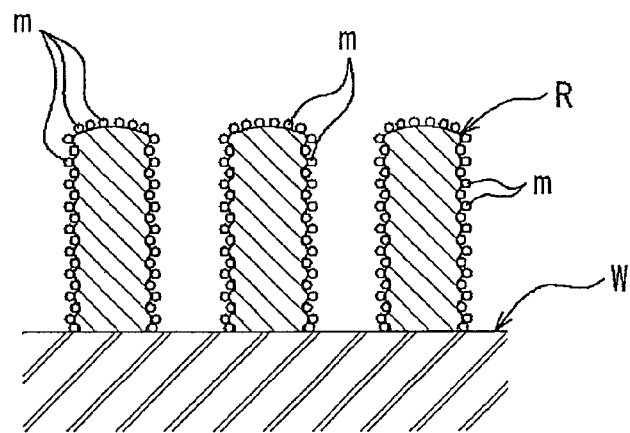
FIGS. 9A, 9B, 9C, 9D and 9E are schematic sectional views of a resist pattern in another smoothing process according to the present invention.
Figures 9B, 9C:
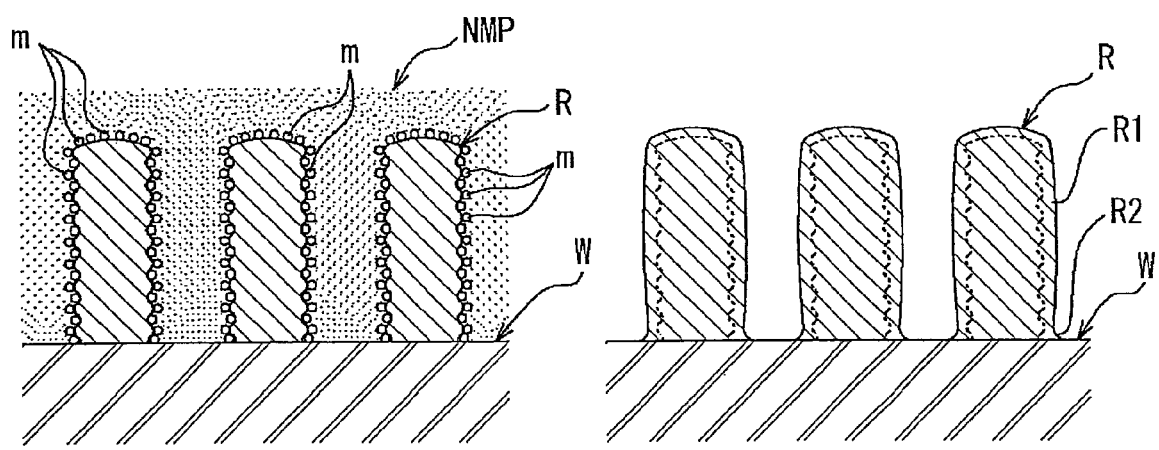
Figures 9D, 9E:
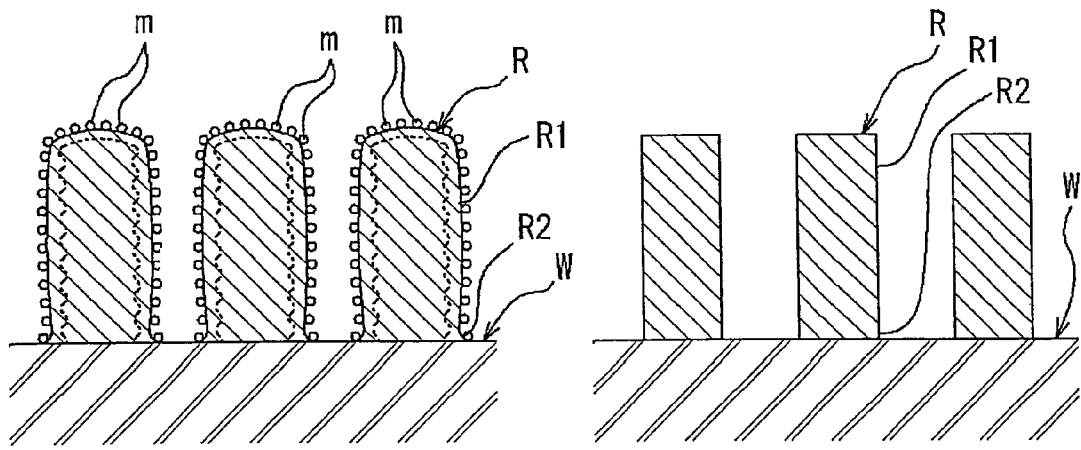

Although the posttreatment process for removing the solvent s and the water molecules m adhering to the resist pattern R after the smoothing process by drying has been described, the solvent s and the water molecules m adhering to the resist pattern R may be removed by a posttreatment process that coats the swollen surface of the resist pattern R swollen by the smoothing process again with water molecules m as shown in FIG. 9D to entice the solvent s and the water molecules m adhering to the resist pattern R and removes the solvent s and the water molecules m by drying. The latter posttreatment process, similarly to the pretreatment process, can coating the surface of the resist pattern R with water molecules m by spraying water molecules (pure water mist) on the surface of the swollen resist pattern R on the wafer W by the mist nozzle 61 and can surely remove the solvent s and the water molecules m. A pretreatment process, a smoothing process and a posttreatment process respectively illustrated by FIGS. 9A, 9B and 9C are the same as those illustrated by FIGS. 7A, 7B and 7D, respectively, and hence parts shown in FIGS. 9A, 9B and 9C like or corresponding to those shown in FIGS. 7A, 7B and 7D are designated by the same reference characters and the description thereof will be omitted.

Figure 10A:
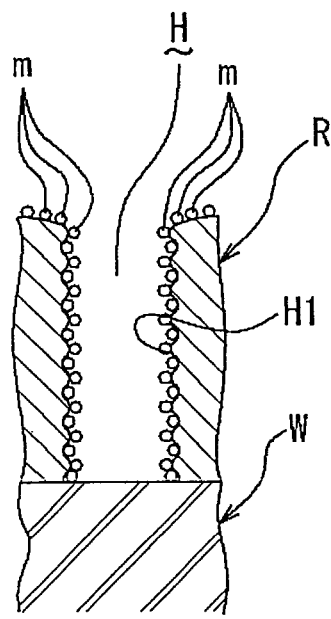
FIGS. 10A, 10B, 10C and 10D are schematic sectional views of a resist pattern provided with holes in a smoothing process.

The foregoing description has been made on an assumption that the resist pattern R has linear elements. A resist pattern provided with holes can be processed by the same pretreatment, smoothing and posttreatment processes. In the pretreatment process, the mist nozzle 61 sprays water molecules (pure water mist) on the surface of a resist pattern R provided with holes H of a diameter slightly greater than a desired diameter to coat the surface of the resist pattern R and the side surfaces H1 of the holes H with water molecules m as shown in FIG. 10A. The motor 52 is actuated to rotate the wafer W in a horizontal plane so that the surface of the resist pattern R and the side surfaces H1 of the holes H may be coated uniformly with the water molecules m. A current is supplied to the Peltier element 54 in a direction such that heat is absorbed to cool the holding surface 51a of the chuck 51 to cool the wafer W. Consequently, the water molecules m coating the surface of the resist pattern R and the side surfaces H1 of the holes H1 condense on and adhere closely to the surface of the resist pattern R and the side surfaces H1 of the holes H.

Figure 10B:
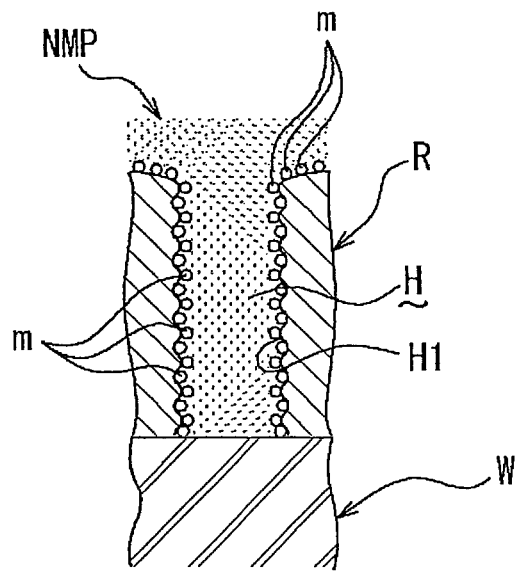
Figure 10C:
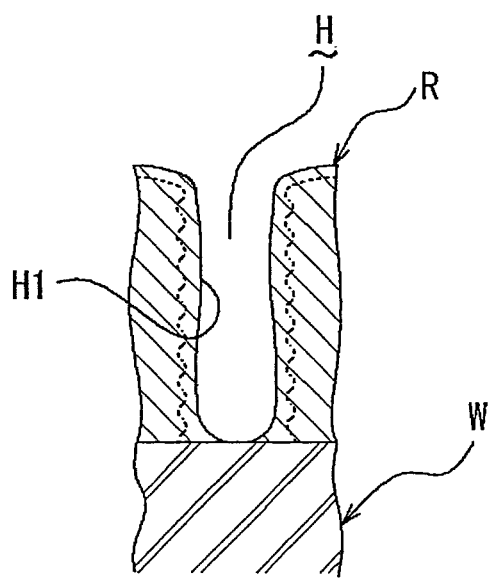

In the smoothing process subsequent to the pretreatment process, the solvent spouting nozzle 71 that moves back and forth above the wafer W spouts a solvent vapor, such as a NMP vapor, onto the surface of the resist pattern R on the wafer W and the side surfaces H1 of the holes H to combine the solvent s with the water molecules m adhering to the surface of the resist pattern R and the side surfaces H1 of the holes H. Consequently, the surface of the resist pattern R and the side surfaces H1 of the holes H are caused to swell by the solvent s as shown in FIGS. 10B and 10C.

Figure 10D:
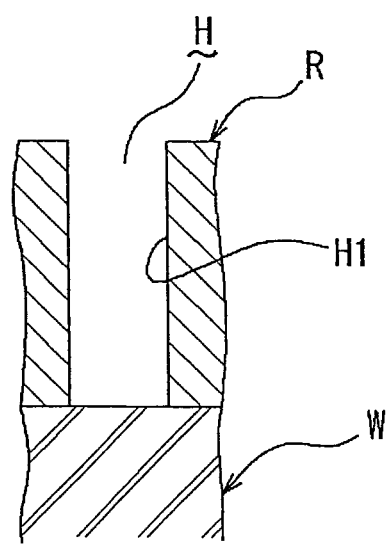

In the posttreatment process, namely, the heating process, subsequent to the smoothing process, the heating unit 53 carries out the heating process to remove the solvent s and the water molecules m adhering to the surface of the resist pattern R and the side surfaces H1 of the holes H by drying as shown in FIG. 10D.

Figure 11A:
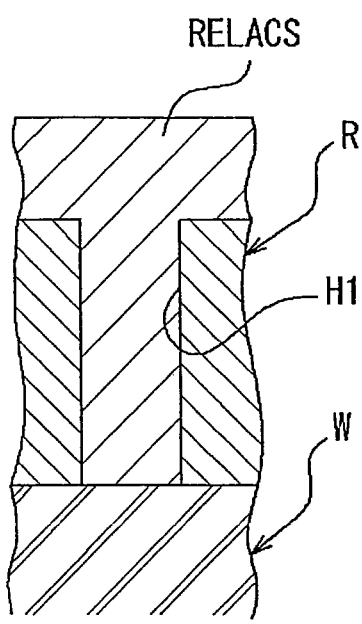
FIGS. 11A, 11B, 11C and 11D are schematic sectional views of a resist pattern provided with holes in a shrinking process.
Figure 11B:
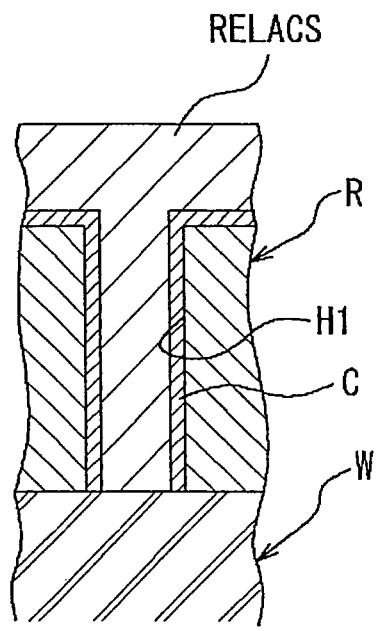
Figure 11C:
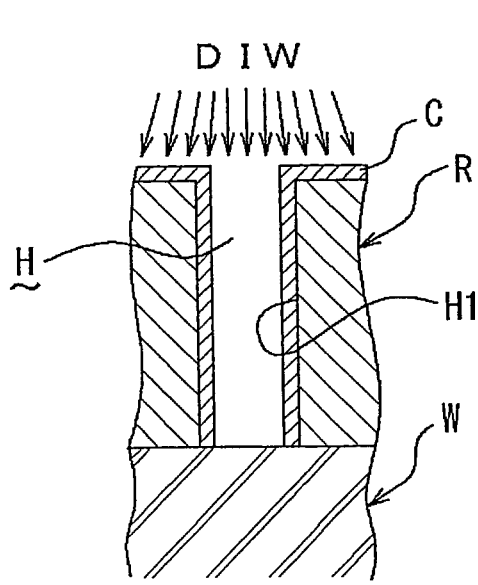
Figure 11D:
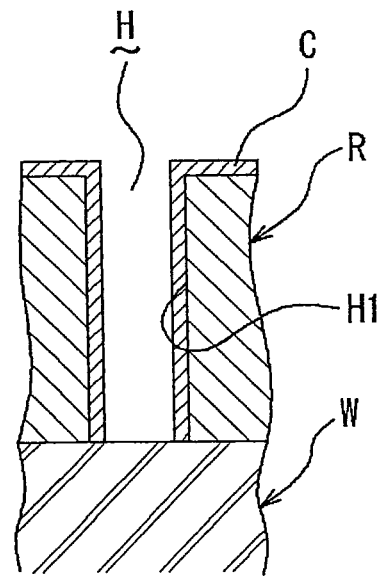
Figure 12:
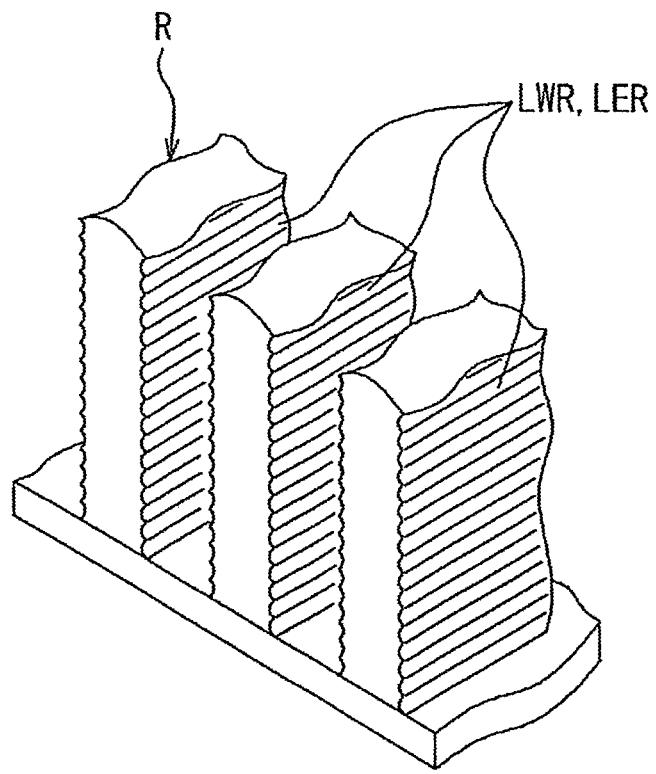
FIG. 12 is a schematic perspective view of a resist pattern having irregularities.
Figure 13:
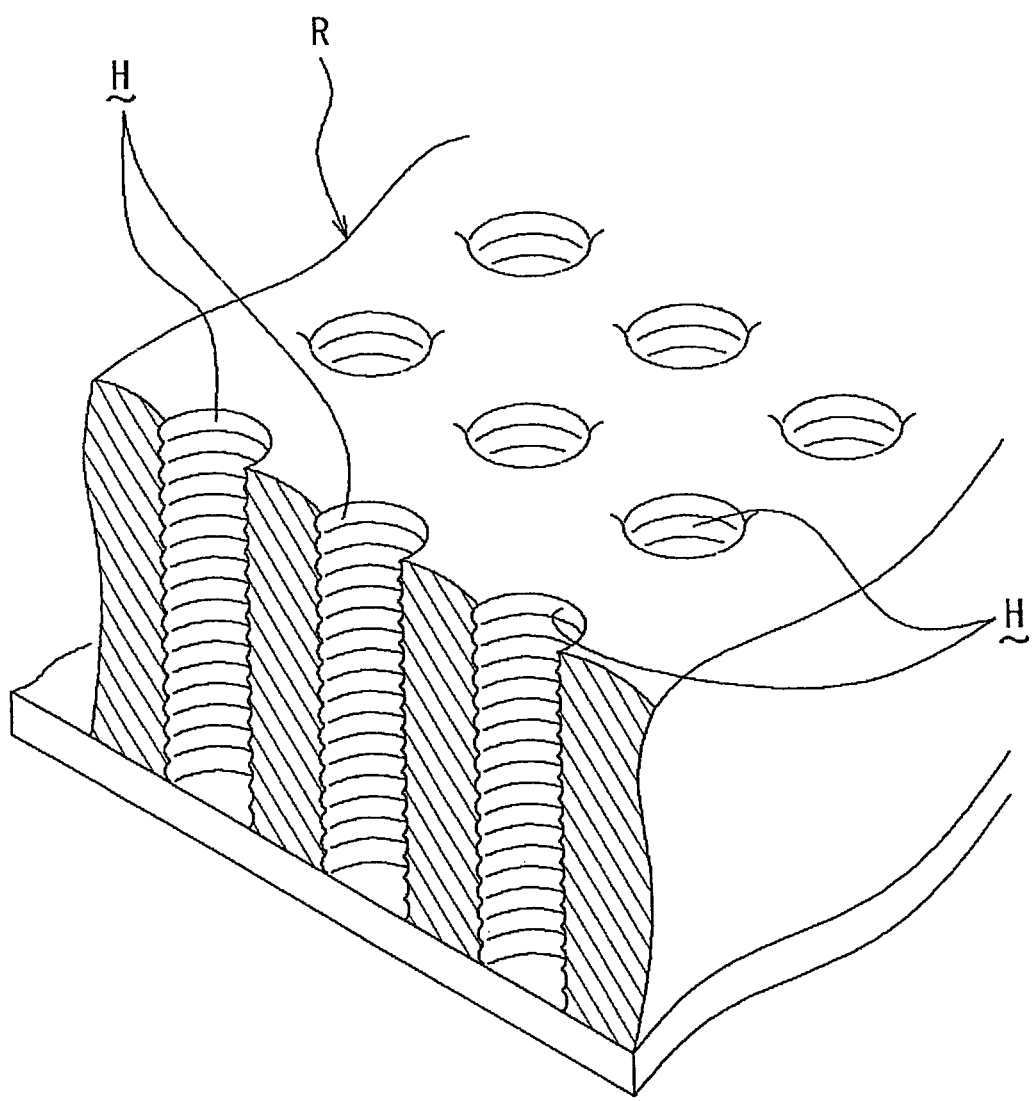
FIG. 13 is a schematic perspective view of a resist pattern provided with holes and having irregularities.

The wafer W thus processed by the smoothing process is subjected to a shrinking process for reducing the diameter of the holes H to form the holes H in the desired diameter. In the shrinking process, the surface of the resist pattern R is coated and the holes H are filled up with a shrinking agent RELACS (resolution enhancement lithography assisted by chemical shrink) as shown in FIG. 11A. Then, the wafer W coated with the shrink agent RELACS is heated at a temperature, for example, in the range of 120° C. to 150° C. to form a bridge layer C between a layer of the shrink agent RELACS and the surface of the resist pattern R and to form a bridge layer C between the side surface of each of the holes H and the layer of the shrink agent RELACS as shown in FIG. 11B. The thickness of the bridge layers C can be adjusted by adjusting the heating temperature. The thicker bridge layers C can be formed by heating at higher temperatures. For example, a shrinkage of 20 nm can be achieved. Then, the surface of the resist pattern R and the holes H are cleaned with a cleaning liquid, such as pure water (deionized water, namely, DIW) to complete the resist pattern R provided with the holes H of the desired diameter as shown in FIGS. 11C and 11D.

The variation of the shrinkage of a resist pattern provided with minute holes can be reduced by applying the smoothing method of the present invention to the shrinking process.

The operation of the coating and developing system provided with the smoothing system 50 will be described.

In the cassette station 10, the lid opening device opens the lid of a precedent cassette 1 containing unprocessed wafers W and placed on a cassette table 2. Then, the wafer carrying arm 4 accesses the wafer cassette 1 and takes out a wafer W from the cassette 1. The wafer carrying arm carries the wafer W to the alignment unit ALIM included in the third group G3 of the processing station 20 and places the wafer W on the wafer table 24 of the alignment unit ALIM. The wafer W placed on the wafer table 24 is subjected to orientation flat location and centering. Subsequently, the main wafer carrying mechanism 21 approaches the alignment unit ALIM from the opposite direction to receive the wafer W from the wafer table 24.

In the processing station 20, the main wafer carrying mechanism 21 carries the wafer W first to the adhesion promoting unit AD of the third group G3. The adhesion promoting unit AD processes the wafer W by an adhesion promoting process. After the completion of the adhesion promoting process, the main wafer carrying mechanism 21 carries the wafer W from the adhesion promoting unit AD to the cooling unit COL of the third group G3 or the fourth group G4. The cooling unit COL cools down the wafer W at a set temperature at which the wafer W is to be cooled prior to the coating process, such as 23° C. After the wafer W has been properly cooled, the main wafer carrying mechanism 21 carries the wafer W from the cooling unit COL to the coating unit COT of the first group G1 or the second group G2. The coating unit COT processes the wafer W by a spin-coating process to coat a surface of the wafer W with a resist film of a uniform thickness.

After the completion of the coating process, the main wafer carrying mechanism 21 carries the wafer W from the coating unit COT to the hot plate unit HP and places the wafer W on a table in the hot plate unit HP. The hot plate unit HP processes the wafer W by a prebaking process which heats the wafer W at a predetermined temperature, such as 100° C., for a predetermined time to remove a solvent contained in the resist film. After the completion of the prebaking process, the main wafer carrying mechanism 21 carries the wafer W from the hot plate unit HP to the extension cooling unit EXTCOL of the fourth group G4. The extension cooling unit EXTCOL cools down the wafer W at a temperature suitable for the edge exposure process to be carried out by the edge exposure device 33, such as 24° C. After the wafer W has been properly cooled, the main wafer carrying device 21 carries the wafer W to the extension unit EXT right above the extension cooling unit EXTCOL and places the wafer W on a table, not shown, disposed in the extension unit EXT. Then, the carrying arm 34 of the interface unit 30 accesses the extension unit EXT from the opposite direction and carries the wafer W from the extension unit EXT to the edge exposure device 33 of the interface unit 30. The edge exposure device 33 irradiates an unnecessary part of the resist film on a peripheral part of the surface of the wafer W with light for an edge exposure process.

After the completion of the edge exposure process, the carrying arm 34 carries out the wafer W from the box of the edge exposure device 33 and delivers the wafer W to the wafer receiving table, not shown, of the exposure system 40 adjacent to the interface unit 30.

The wafer W is returned to the wafer receiving table after the wafer W has been processed by an exposure process by the exposure system 40. Then, the carrying arm 34 of the interface unit 30 carries the wafer W from the wafer receiving table of the exposure system 40 to the extension unit EXT of the fourth group G4 of the processing station 20 and places the wafer on the wafer receiving table.

The main wafer carrying mechanism 21 carries the wafer W from the wafer receiving table to the chilling hot plate unit CHP. The chilling hot plate unit CHP processes the wafer W by a postbaking process which heats the wafer W at, for example 220° C. for a predetermined time to prevent the formation of fringes or to induce the acid catalyst reaction of a chemically amplified resist (CAR). After the completion of the postbaking process, the main wafer carrying mechanism 21 carries the wafer W from the chilling hot plate unit CHP to the cooling unit COL of the third group G3 or the fourth group G4. The cooling unit COL cools down the wafer W at a set temperature at which the wafer W is to be cooled prior to the developing process, such as 23° C.

Subsequently, the wafer W is delivered to one of the developing units DEV of the first group G1 or the second group G2, for example, to the developing unit DEV provided with the smoothing system 50. The developing unit DEV wets the resist film on the surface of the wafer W uniformly with a developer to process the resist film by the developing process. Thus, a latent image of a predetermined circuit pattern formed in the resist film is developed in a circuit pattern, unnecessary parts of the resist film remaining on the wafer W are removed, and a part of the resist film corresponding to an alignment mark formed on the surface of the wafer W is removed. After the completion of the developing process, a cleaning liquid is poured onto the wafer W to rinse away the developer.

Then, the foregoing smoothing procedure is executed to smooth the irregular surface of the resist pattern on the wafer W. That is, the wafer W is processed by the pretreatment process in which the mist nozzle 61 sprays water molecules (pure water mist) on the resist pattern on the surface of the wafer W, the smoothing process in which the solvent spouting nozzle spouts a solvent vapor on the resist pattern coated with the water molecules and a posttreatment process which rotates the wafer W at a high rotating speed by the motor 52 to remove the solvent and the water molecules from the resist pattern by spin drying. Thus the irregular surface of the resist pattern is smoothed.

After the completion of the smoothing procedure, the main wafer carrying mechanism 21 carries out the wafer W from the smoothing system 50 of the developing unit DEV and delivers the wafer W to the hot plate unit HP of the third group G3 or the fourth group G4. The hot plate unit HP carries out a postbaking process which heats the wafer W, for example, at 100° C. for a predetermined time. Consequently, the resist pattern swollen by the developing process is hardened and the chemical resistance of the resist pattern is improved.

After the completion of the postbaking process, the main wafer carrying mechanism 21 carries out the wafer W from the hot plate unit HP and delivers the wafer W to one of the cooling units COL. After the wafer W has been cooled at an ordinary temperature, the main wafer carrying mechanism 21 carries the wafer W to the extension unit EXT of the third group G3. Upon the placement of the wafer W on the table of the extension unit EXT, the wafer carrying arm 4 of the cassette station 10 takes up the wafer W from the table from the opposite direction. The wafer carrying arm 4 put the wafer W into a predetermined wafer holding slot of the wafer cassette 1 for containing processed wafers W, placed on the cassette table. After the wafer cassette 1 has been fully loaded with processed wafers W, the lid opening device 5 put the lid on the wafer cassette to close the wafer cassette 1. Thus, a wafer processing procedure for processing a wafer is completed.

What is claimed is:

1. A substrate processing system for smoothing an irregular surface of a resist pattern formed on a surface of a substrate by an exposure process and a developing process, said substrate processing system comprising:
    a substrate holding table provided with a holding surface, the substrate holding table being for holding a substrate on the holding surface with the surface of the substrate facing up, the substrate holding table being provided with a cooling means for cooling the substrate by cooling the holding surface;
    a water molecule spraying nozzle for spraying water molecules on a surface of the resist pattern on the substrate under a condition that the substrate is cooled by the cooling means to a low temperature at which the water molecules condense on and adhere to the resist pattern;
    a solvent vapor spouting nozzle for spouting a solvent vapor of a water-soluble solvent onto the surface of the resist pattern on the substrate; and
    a drying means for removing the water molecules and the solvent adhering to the surface of the resist pattern.

2. The substrate processing system according to claim 1, wherein the drying means is a rotational driving mechanism for rotating the substrate holding table about a vertical axis.

3. The substrate processing system according to claim 1, wherein the drying means is a heating device provided with a hot plate for supporting the substrate thereon.

4. A substrate processing system comprising:
    a substrate holding table provided with a holding surface, the substrate holding table being for holding a substrate on the holding surface with a surface of the substrate facing up and a resist pattern on the surface;
a cooling unit that that cools the substrate by cooling the holding surface;
a water molecule spraying nozzle that sprays water molecules on a surface of the resist pattern on the substrate under a condition that the substrate is cooled by the cooling unit to a low temperature at which the water molecules condense on and adhere to the resist pattern;
a solvent vapor spouting nozzle that spouts a solvent vapor of a water-soluble solvent onto the surface of the resist pattern on the substrate; and
a drying unit that removes the water molecules and the solvent adhering to the surface of the resist pattern.

* * * * *